United States Patent
Lavoie et al.

(10) Patent No.: US 12,102,016 B2
(45) Date of Patent: Sep. 24, 2024

(54) AMORPHOUS SUPERCONDUCTING ALLOYS FOR SUPERCONDUCTING CIRCUITS

(71) Applicants: Christian Lavoie, Pleasantville, NY (US); Benjamin Wymore, Cortlandt Manor, NY (US); Markus Brink, White Plains, NY (US); Stephen L Brown, Carmel, NY (US)

(72) Inventors: Christian Lavoie, Pleasantville, NY (US); Benjamin Wymore, Cortlandt Manor, NY (US); Markus Brink, White Plains, NY (US); Stephen L Brown, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 984 days.

(21) Appl. No.: 16/918,708

(22) Filed: Jul. 1, 2020

(65) Prior Publication Data
US 2022/0005999 A1    Jan. 6, 2022

(51) Int. Cl.
*H10N 60/85*    (2023.01)
*H10N 60/01*    (2023.01)

(52) U.S. Cl.
CPC ............. *H10N 60/85* (2023.02); *H10N 60/01* (2023.02)

(58) Field of Classification Search
CPC .................................................... H10N 60/85
See application file for complete search history.

(56) References Cited

U.S. PATENT DOCUMENTS

| | | | |
|---|---|---|---|
| 3,427,154 A | 2/1969 | Mader et al. | |
| 4,861,751 A | 8/1989 | Tenhover | |
| 4,995,923 A * | 2/1991 | Mizumoto | G11B 5/64 420/466 |
| 5,449,659 A | 9/1995 | Garrison et al. | |
| 8,148,300 B2 | 4/2012 | Matsumoto et al. | |
| 2012/0065072 A1* | 3/2012 | Hays | G01R 33/035 427/63 |
| 2015/0179914 A1 | 6/2015 | Greer et al. | |
| 2016/0170675 A1* | 6/2016 | Pickerell | H10N 60/857 711/103 |
| 2019/0044046 A1* | 2/2019 | Caudillo | G06N 10/00 |

OTHER PUBLICATIONS

Spencer et al. "Superconductivity of Ta—Zr films produced by Co-sputtering". IEEE Trans. Magn. 17, 322 (1981). (Year: 1981).*
Hopfield., "Angular Momentum and Transition-Metal Superconductivity" Phys. Rev. 186, No. 2, 443 (1969). 9 pages.
(Continued)

*Primary Examiner* — Paul A Wartalowicz
(74) *Attorney, Agent, or Firm* — Amin, Turocy & Watson, LLP

(57) ABSTRACT

Techniques facilitating formation of amorphous superconducting alloys for superconducting circuits are provided. A device can comprise one or more superconducting components that comprise an amorphous superconducting alloy comprising two or more elements. At least one element of the two or more elements is a superconducting element.

20 Claims, 14 Drawing Sheets
(8 of 14 Drawing Sheet(s) Filed in Color)

(56) References Cited

OTHER PUBLICATIONS

Crow et al., "The Superconducting Transition Temperatures of Disordered Nb, W, and Mo Films" Phys. Lett. 30A, 161 (1969). 2 pages.
Grünbaum et al., "Polytopes, Graphs, and Complexes" Bull. Amer. Phys. Soc. 15, 343 (1970). 71 pages.
Fisher et al., "Dipolar Interactions at Ferromagnetic Critical Points" Phys. Rev. Lett. 30, 92 (1973) 4 pages.
Kes et al., "Two-dimensional collective flux pinning, defects, and structural relaxation in amorphous superconducting films" Phys. Rev. B 28, 5126 (1983) 14 pages.
Raffy et al., "Localization and interaction effects in two-dimensional W-Re films" Phys. Rev. B 28, 6607 (1983). 3 pages.
Graybeal et al., "Localization and interaction effects in ultrathin amorphous superconducting films" Phys. Rev. B 29, 4167 (1984). 3 pages.

\* cited by examiner

AMORPHOUS SUPERCONDUCTING ALLOYS FOR SUPERCONDUCTING CIRCUITS

BACKGROUND

The subject disclosure relates to quantum computing and quantum circuits and, more specifically, to facilitating the use of amorphous superconducting alloys for superconducting circuits.

Traditional formation of a microstructure for use in a resonator and/or qubit can lead to roughness at surfaces which can increase losses. Such losses can decrease the quality factors of the resonators and/or the qubits. Further, traditional structures do not remain amorphous through anneal processes and, thus, can crystallize during the anneal processes.

For example, Greer et al. (U.S. Patent Application Publication No. 2015/0179914) discusses that a "superconducting wiring material may be a refractory metal with a high melting point." See paragraph [0009]. "For example, niobium (Nb) and molybdenum (Mo) are superconducting refractory metals with melting points above 2700 C." See id. Thus, Greer et al. uses standard crystalline alloys of high melting point in an attempt to force a crystallization of deposited amorphous silicon. However, Greer et al. does not remain amorphous through the anneal processes necessary for device fabrication.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, amorphous superconducting alloys for superconducting circuits are provided. The superconducting circuits that comprise the superconducting alloys can be utilized in various systems, computer-implemented methods, apparatuses, devices, circuits, and/or computer program products.

According to an embodiment, a quantum circuit can comprise one or more superconducting components that comprise an amorphous superconducting alloy of two or more elements. At least one element of the two or more elements is superconducting. An advantage of such a quantum circuit is an increase in a quality factor, resulting in a better performing qubit.

According to another embodiment, a device can comprise one or more superconducting components that comprise an amorphous superconducting alloy comprising two or more elements. At least one element of the two or more elements is a superconducting element. An advantage of such a device is smoothness at surfaces, which can mitigate or decrease microwave losses.

Another embodiment relates to a method that can comprise selecting two or more elements. At least one element of the two or more elements is superconducting. The method also can comprise forming amorphous superconducting components using the two or more elements. The amorphous superconducting components can be adapted to interface with one or more quantum components of a quantum circuit. An advantage of such a method is that the quality factors of resonators and qubits can be increased.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
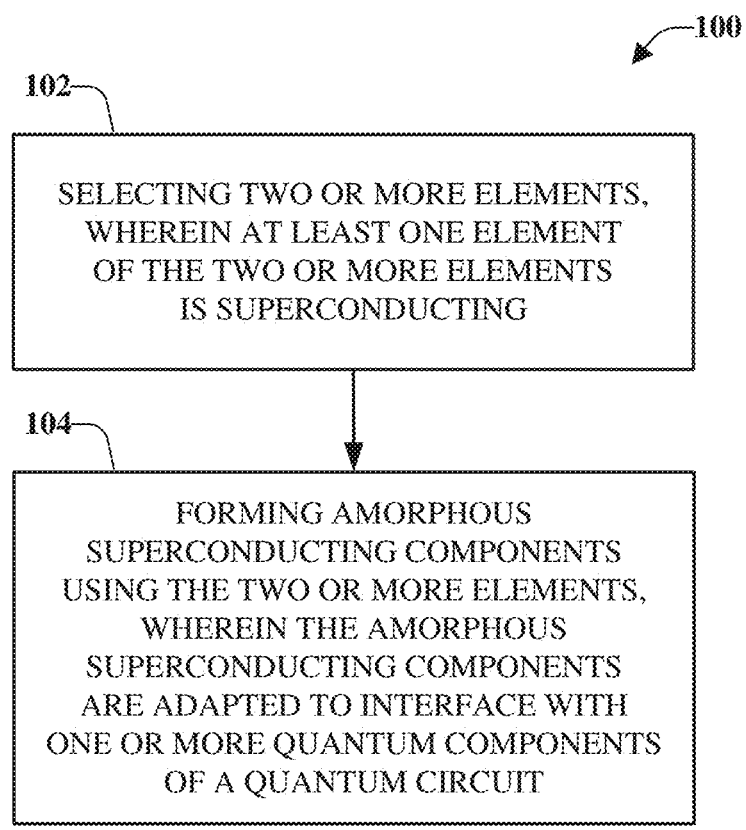
FIG. 1 illustrates a flow diagram of an example, non-limiting, method that facilitates use of amorphous superconducting alloys for superconducting circuits in accordance with one or more embodiments described herein.

FIG. 1 illustrates a flow diagram of an example, non-limiting, method 100 that facilitates use of amorphous superconducting alloys for superconducting circuits in accordance with one or more embodiments described herein. Benefits of the method 100 (as well as other embodiments discussed herein) is that the amorphous superconducting alloys provide an increase in a quality factor, resulting in a better performing qubit and/or resonator. Another benefit is smoothness at surfaces of the amorphous superconducting alloys, which can mitigate or decrease microwave losses. A further benefit is that quality factors of resonators and qubits can be increased.

The method 100 starts, at 102, with selecting two or more elements. Selection of the two or more elements can be based on a determination that a mixture of the two or more elements renders a material that is amorphous. A problem associated with traditional resonators and qubits is that the microstructure can comprise roughness at surfaces, which can increase microwave losses and decrease the quality factors of resonators and qubits. A solution provided herein is to mitigate, reduce, or eliminate microstructure in thin films using alloying by building superconducting alloys that are amorphous. For example, the selection, at 102, can be a mixture of elements that do not form intermetallic compounds. In another example, the selection can be elements with different sizes and with little miscibility. According to another example, the elements can be selected as elements for which a current process does not need to be modified, such as, for example but not limited to, Tantalum-Zirconium (Ta—Zr) alloys.

In further detail, to mitigate, reduce, and/or eliminate grain boundaries, the elements (or alloys) selected at 102 can be built from amorphous alloys. The criteria or guideline parameters for two or more elements to form amorphous alloys can include, but is not limited to different crystal structures, superconducting, no intermetallic compounds, different atomic sizes (atomic radii), no miscibility and/or very low solubility, and "patternable" and/or compatibility with current processes. A superconducting element can be selected in order for the qubit to be made at very low temperature (e.g., temperatures utilized for quantum computing). In some implementations, two or more of the guideline parameters can be utilized. In some implementations, as many of the guideline parameters as possible can be utilized.

In some implementations, the two or more elements selected can be metal. In some implementations, the two or more elements selected can be non-metal. Alternatively, in some implementations, the two or more elements selected can comprise metal or non-metal. Elements of the two or more elements can be mixing elements selected from a periodic table of elements.

According to some implementations, at least one element of the two or more elements is superconducting. However, the disclosed aspects are not limited to these implementations, and the two or more elements can be non-superconducting, provided a mixture of the two or more elements results in a superconducting mixture.

Further, at 104, the method 100 comprises forming amorphous superconducting components using the two or more elements. The amorphous superconducting components can be adapted to interface with one or more quantum components and/or quantum hardware of a quantum circuit.

Forming the amorphous superconducting components can comprise mixing the two or more elements. For example, the mixing can be performed during a deposition process and/or during a formation process. The mixing of the two or more elements can produce an amorphous layer as discussed herein. It is also noted that the elements selected, at 102, are not typically available in amorphous form, at least not at room temperature.

In some implementations, the two or more elements selected at 102 can be deposited on a room temperature substrate (e.g., silicon, sapphire). For example, the two or more elements can be deposited on the substrate using a sputtering process. A problem associated with traditional depositing of amorphous alloys is that such alloys were deposited through evaporation on small substrates at very low temperature (e.g., very close to four degrees Kelvin (4 K)). If liquid nitrogen is used, the temperature is about 77 K, if liquid He is used, the temperature is about 4 K. These temperatures are typically referred to as cryogenic temperatures and the colder the temperature, the more chance of the elements becoming amorphous. Further, at 77 K, it is easier to obtain amorphous film that at room temperature (e.g., 25° C. or 298 K).

A solution provided with the disclosed aspects is that the alloys can be sputtered at around room temperature. In an example, the alloys can be sputtered on a wafer (e.g., an 8 inch wafer, a 12 inch wafer, or other size wafer) at around room temperature. It is noted that a cooling system for manufacturing on an 8 or 12 inch platform can typically reach negative forty degrees Celsius (−40° C. or 233 K) which is hot in comparison to 4 K. Accordingly, the alloys can be deposited without the use of specialized or additional cooling systems.

It is noted that sputtering can provide more control on deposition rate. The amorphous superconducting alloys discussed herein can be utilized for superconducting circuits and, thus, are intended to be operated at a very low temperature. A process used for sputtering targets, which is easier to control, and can be performed at room temperature (and will not be crystalline before reaching room temperature). Thus, there is the challenge of depositing an amorphous material at room temperature, which can be solved as discussed herein.

Although discussed with respect to a sputtering process, according to some implementations, two or more elements can be deposited on the substrate using an evaporation process or another type of process.

Figure 2:
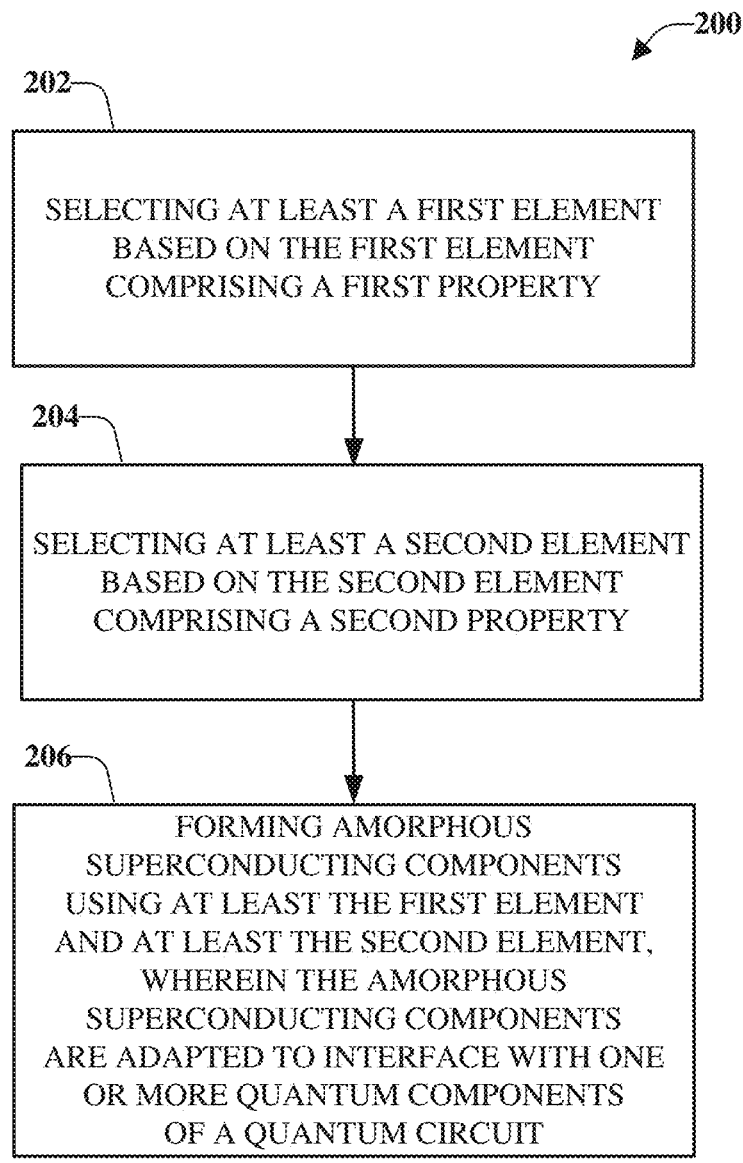
FIG. 2 illustrates a flow diagram of an example, non-limiting, method that facilitates selecting use of amorphous superconducting alloys for superconducting circuits in accordance with one or more embodiments described herein.

FIG. 2 illustrates a flow diagram of an example, non-limiting, method 200 that facilitates selecting use of amorphous superconducting alloys for superconducting circuits in accordance with one or more embodiments described herein.

At 202, at least a first element is selected based on a first determination that the first element comprises a first property. In an example, the first property can be that the first element exhibits a first crystal structure. In another example, the first property can be an atomic size. In a further example, the first property can be the absence of intermetallic compounds (e.g., can be void of intermetallic compounds). In yet another example, the first property can be the ability to remain amorphous to at least a defined temperature.

Further, at 204, at least a second element can be selected based on a second determination that the second element comprises a second property. In an example, the second property can be that the second element exhibits a second crystal structure. In another example, the second property can be an atomic size. In a further example, the second property can be the absence of intermetallic compounds (e.g., can be void of intermetallic compounds). In yet another example, the second property can be the ability to remain amorphous to at least a defined temperature.

According to some implementations, the second property can be different from the first property. Alternatively, the second property and the first property can be a same property. Although discussed with respect to two properties, more than two properties can be utilized with the disclosed aspects.

By way of example and not limitation, the first element can exhibit a first crystal structure and the second element can exhibit a second crystal structure different from the first crystal structure. In this scenario, the different crystal structures prevent the mixture of elements from forming its own crystal structure and thus keeping the mixture amorphous. If two elements of the same crystal structure are selected, there is a chance that those elements, when mixed together, will be miscible. In an example, a first element can be selected that comprises a first geometric shape and a second element can be selected that comprises a second geometric shape. In a non-limiting example, the first element can be orthorhombic (or tetragonal or hexagonal and so on), and the second element can be cubic. By mixing elements that favor different crystal structures, the mixture tends to remain amorphous to a reasonably high temperature as it cannot favorably crystallize in either crystalline structures.

In another example, the first element can comprise a first atomic size and the second element can comprise a second atomic size different from the first atomic size. Different atomic sizes assist with the element not being miscible because a first atom cannot easily take the place of a second atom.

Further, although discussed with respect to two elements, more than two elements can be mixed to form an amorphous superconducting alloy of two or more elements. Further to these implementations, the amorphous metal alloy can remain amorphous to an elevated temperature. For example, the elevated temperature can be at least about 600 degrees Celsius.

In accordance with some implementations, selecting the first element and at least the second element can comprise selecting tantalum and zirconium. In an alternative, or additional, implementation, selecting the first element and at least the second element can comprise selecting molybdenum and rhenium. According to an additional, or alternative, implementation, selecting the first element and at least the second element can comprise selecting molybdenum, rhenium, and lanthanum.

In some implementations, selecting the first element and at least the second element can comprise selecting elements from a group of elements based on the selected elements exhibiting a low solubility in other elements that form an amorphous alloy. For example, when the first element and the second element are mixed together and/or with other elements, the resulting mixture (e.g., the amorphous alloy) comprises elements that exhibit very low solubility (e.g., ~<1 at. %).

The method 200 can continue, at 206, with forming amorphous superconducting components using the two or more elements. The amorphous superconducting components are adapted to interface with one or more quantum components of a quantum circuit.

A problem associated with traditional alloys is that attempts have been made to make amorphous alloys using two evaporation sources and a substrate that is maintained at very low temperature (liquid nitrogen or below). While such attempts to make amorphous alloys have been successful, the sample size is very much restricted to small samples (not 8 or 12 inch wafers) on which the alloy composition would not be uniform across the sample. Also, typical heating of these amorphous alloys to room temperature is often sufficient to crystallize the material. A solution provided herein is that films can be prepared by sputtering, not by evaporation. Sputtering is a deposition mechanism that is much more controlled than evaporation and thus much more applicable to larger samples (including 8" and 12" wafers). In addition, the films discussed herein need to be metastable to much higher temperatures (compared to room temperature) to withstand the anneals required by device processing. The alloys selected can be stable to at least about 600° C., some to around 800° C.

Figure 3:
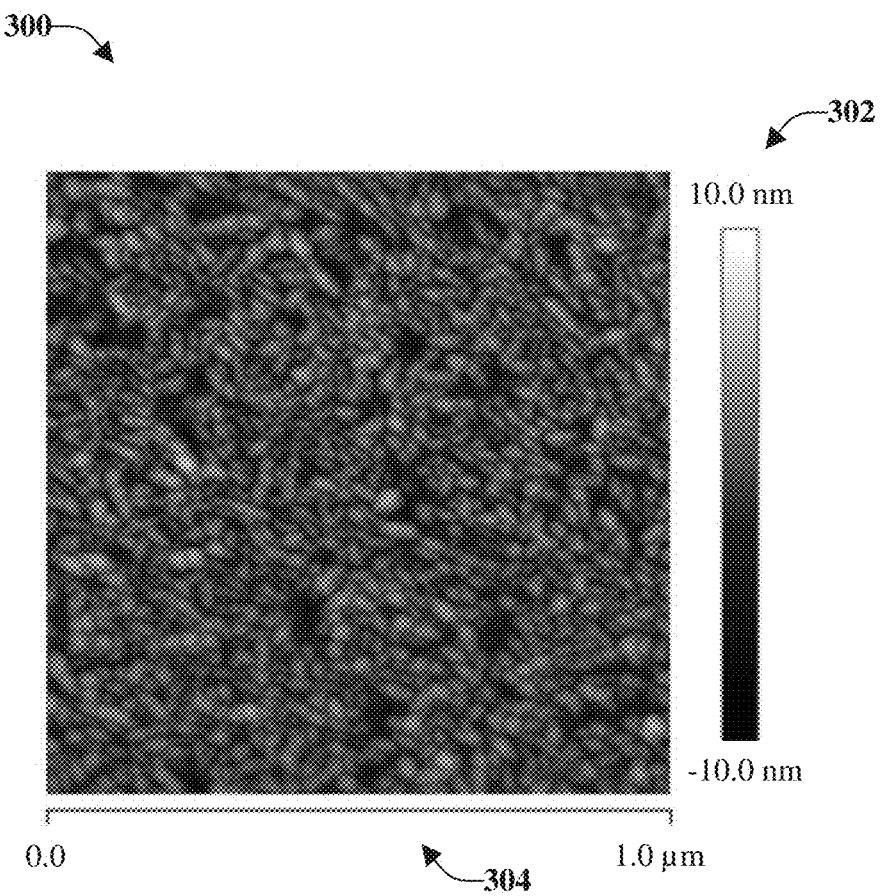
FIG. 3 illustrates an example, non-limiting, surface of a film of a resonator after processing in accordance with one or more embodiments described herein.

In further detail, FIG. 3 illustrates an example, non-limiting, surface of a film 300 of a resonator after processing in accordance with one or more embodiments described herein. The surface of the film 300 is a Niobium (Nb) film which is 200 nanometer (nm) thick for purposes of explanation. A scale 302 of different hues defining the roughness of the surface in nm is illustrated on the right of the image and a lateral scale 304 for image size is given, in micrometers (μm).

As Quality (Q) factors of resonators in superconducting quantum circuits are, for example, above 1E6, materials, defects, or non-uniformities can affect the quality factors of resonators. Further, the material, defects, and non-uniformity of quantum circuits can cause changes in the microstructure. For example, the materials from which the resonators are built, have a micro-structure (poly crystal grain size) which is on the order of the resonator thickness (around 50 to about 300 nanometer (nm)). Through standard thin film processing, these metal films (typically niobium) can be exposed to high energy bombardment or etching ambients (liquid solutions or Reactive Ion Etching). Based on the local non uniformity due to microstructure, these various processes can lead to roughness at surfaces which increases losses that, in turn, decrease the quality factors of resonators and qubits.

The film 300 depicted in FIG. 3 demonstrates that processes utilized to form the film can attack or remove some of the material and the grain boundaries can develop a large amount of roughness. A problem associated with the microstructure of the film 300, as well as similar microstructures, is that various processing can lead to roughness at surfaces which can increase the microwave loss, which can decrease the quality factors of resonators and qubits.

Another problem is that the microstructure of the superconducting materials in use today for quantum circuits, is of the order of the size of the Cooper pairs. Grain boundaries and roughness can affect microwave losses in these waveguides. This can lead to small losses that become relevant when quality factors become very high.

A solution provided herein is that when the film is made more uniform, with less defects and scattering points for the carriers included in the devices (e.g., qubit, resonator, and other quantum components) at room temperature, the quality factor can be increased, resulting in a better qubit. A further solution provided herein is a material that is amorphous and reduces, mitigates, or eliminates the grain boundaries. Thus, the material realized through implementation of the disclosed aspects shows the same face independent of the point of reference within the resonator or other component being analyzed.

Figure 4:
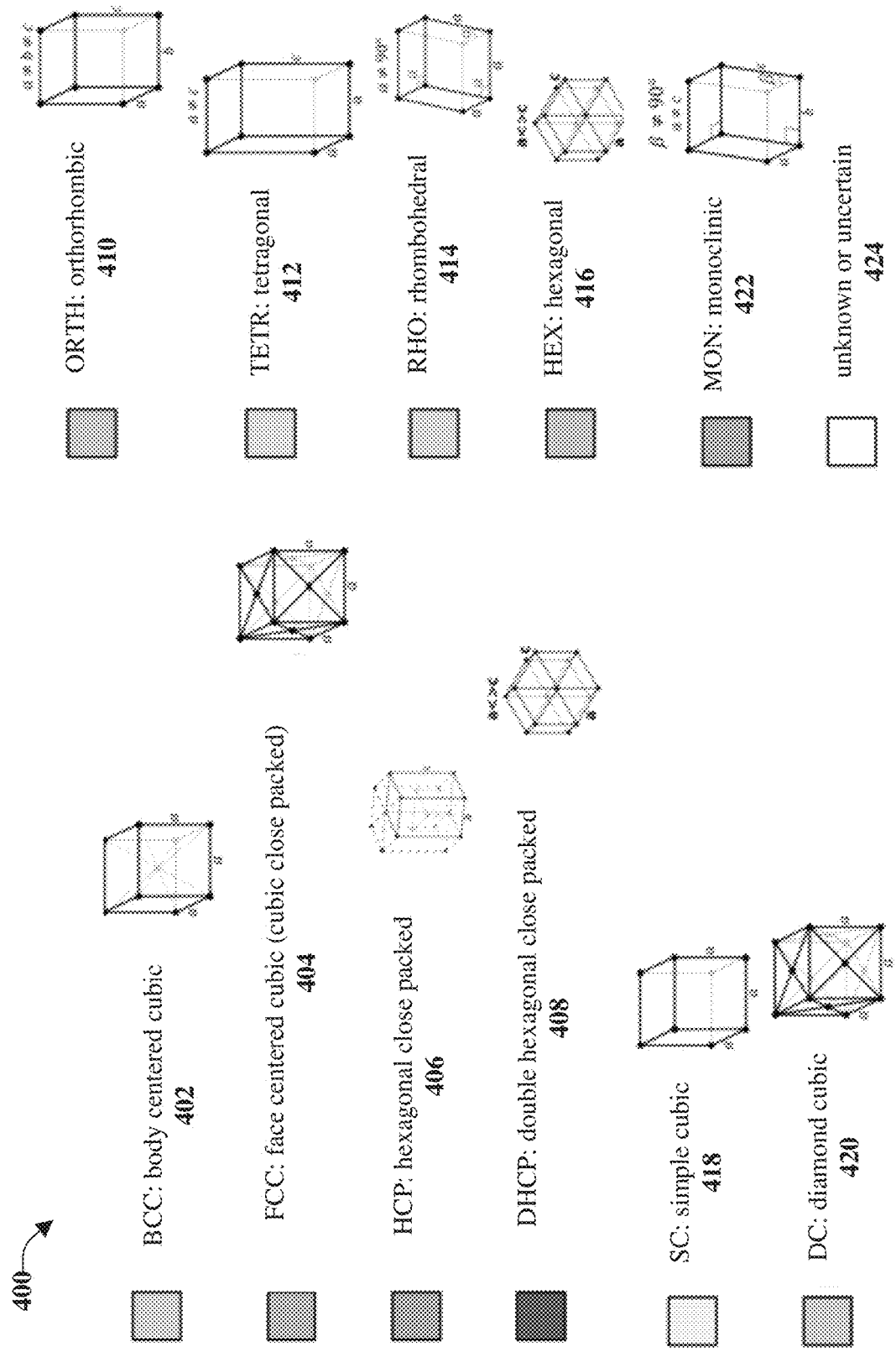
FIG. 4 illustrates an example, non-limiting, chart of crystal structures in accordance with one or more embodiments described herein.

FIG. 4 illustrates an example, non-limiting, chart of crystal structures 400 in accordance with one or more embodiments described herein. The crystal structures 400 of FIG. 4 can be exhibited by metal elements that can be selected in accordance with one or more embodiments described herein. It is noted that the two or more elements selected (e.g., at 102 of FIG. 1 and/or at 202 and 204 of FIG. 2) can be metal elements. However, in some implementations, the elements can be non-metal elements.

For purposes of explanation, various figures are discussed with respect to metal elements. Metal elements having different crystal structures can be selected for the first element and at least the second element. Different crystal structures are chosen because elements with the same crystal structure will tend to be miscible and remain crystalline. Accordingly, elements with different crystal structures should be chosen.

As illustrated in FIG. 4, the crystal structures can include a Body Center Cubic or BCC crystal structure 402, a Face Centered Cubic or FCC crystal structure 404 (cubic close packed), a Hexagonal Close Packed or HCP crystal structure 406, and a Double Hexagonal Close Packed DHCP crystal structure 408. Continuing the example, the crystal structures can include an Orthorhombic or ORTH crystal structure 410, a tetragonal or TETR crystal structure 412, a rhombohedral or RHO crystal structure 414, and a hexagonal or HEX crystal structure 416. Continuing the above example, the crystal structures can include a simple cubic or SC crystal structure 418, a diamond cubic or DC crystal structure 420, and a monoclinic or MON structure 422. In some implementations, there could also be one or more elements for which a crystal structure is not known, which can be denoted as an unknown or uncertain crystal structure 424.

Figure 5:
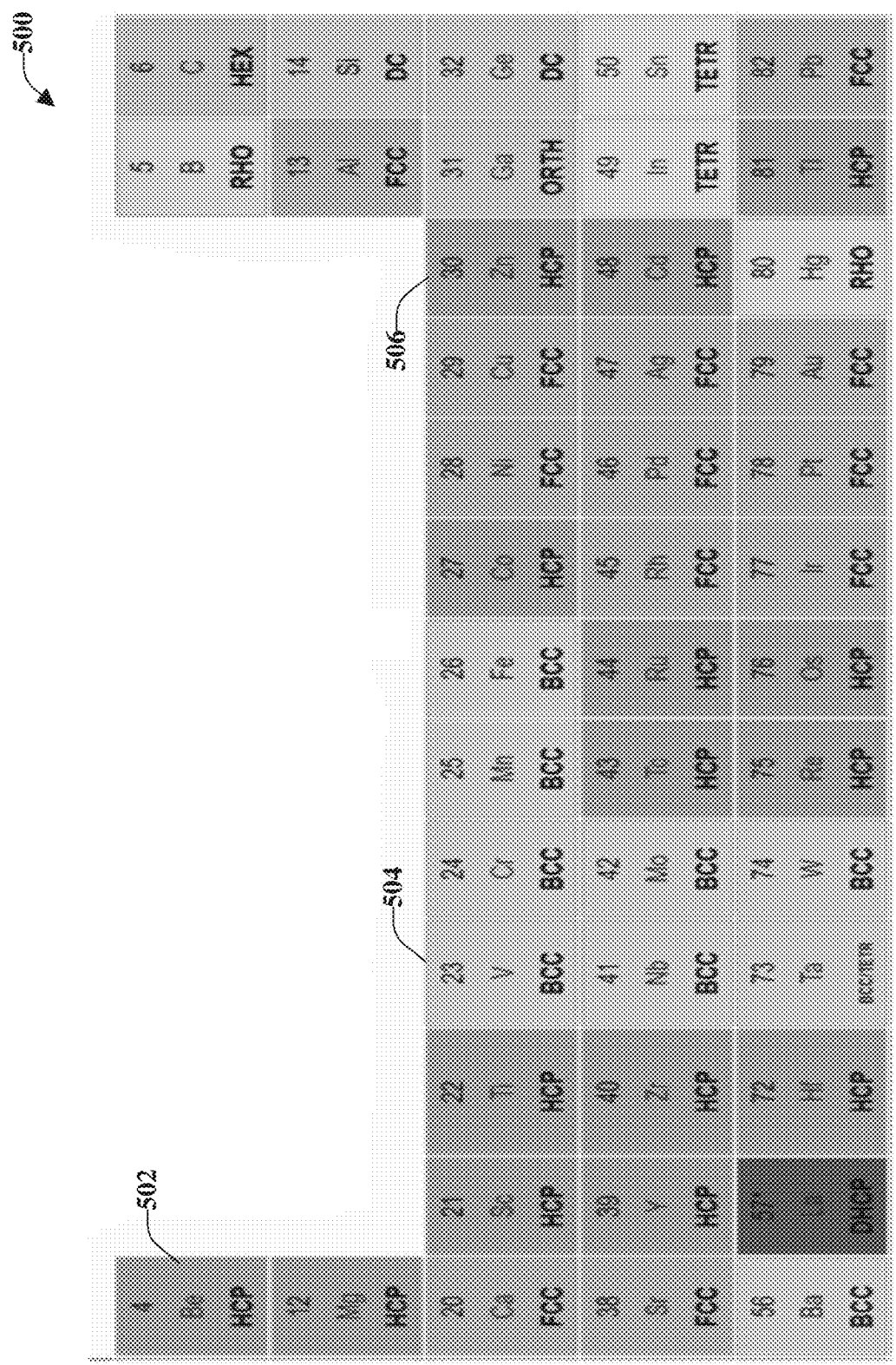
FIG. 5 illustrates an example, non-limiting, chart that identifies elements of a portion of a periodic table having a same crystal structure according to the crystal structures of FIG. 4 in accordance with one or more embodiments described herein.

FIG. 5 illustrates an example, non-limiting, chart 500 that identifies elements of a portion of a periodic table having a same crystal structure according to the crystal structures 400 of FIG. 4 in accordance with one or more embodiments described herein. Repetitive description of like elements employed in other embodiments described herein is omitted for sake of brevity.

The elements in FIG. 5 can be denoted as having a same crystal structure based on naming the structure. For example, a first element 502 is denoted as "4 Be HCP," which is atomic number 4, Beryllium, with the HCP crystal structure 406. In another example, a second element 504 is denoted as "23 V BCC," which is atomic number 23, Vanadium, with the BCC crystal structure 402. In yet another example, a fourth element 506 is denoted as "30 Zn HCP," which is atomic number 30, Zinc, having the HCP crystal structure 406. Other elements in FIG. 5 follow a similar pattern and are not labeled for purposes of simplicity.

It is noted that the boxes within the periodic table can be color coded to indicate the elements having a same crystal structure. For example, all elements that have the HCP crystal structure 406 can be a first hue, all elements that have the BCC crystal structure 402 can be a second hue, all elements that have the FCC crystal structure 404 can be a third hue, all elements that have the RHO crystal structure 414 can be a fourth hue, and so on. Alternatively, or additionally, elements having a same crystal structure can be denoted in another manner such as shading, patterning, and so on. Identifying the elements having a same crystal structure can facilitate selection of two elements (or more than two elements) that have different crystal structures as discussed herein.

Figure 6:
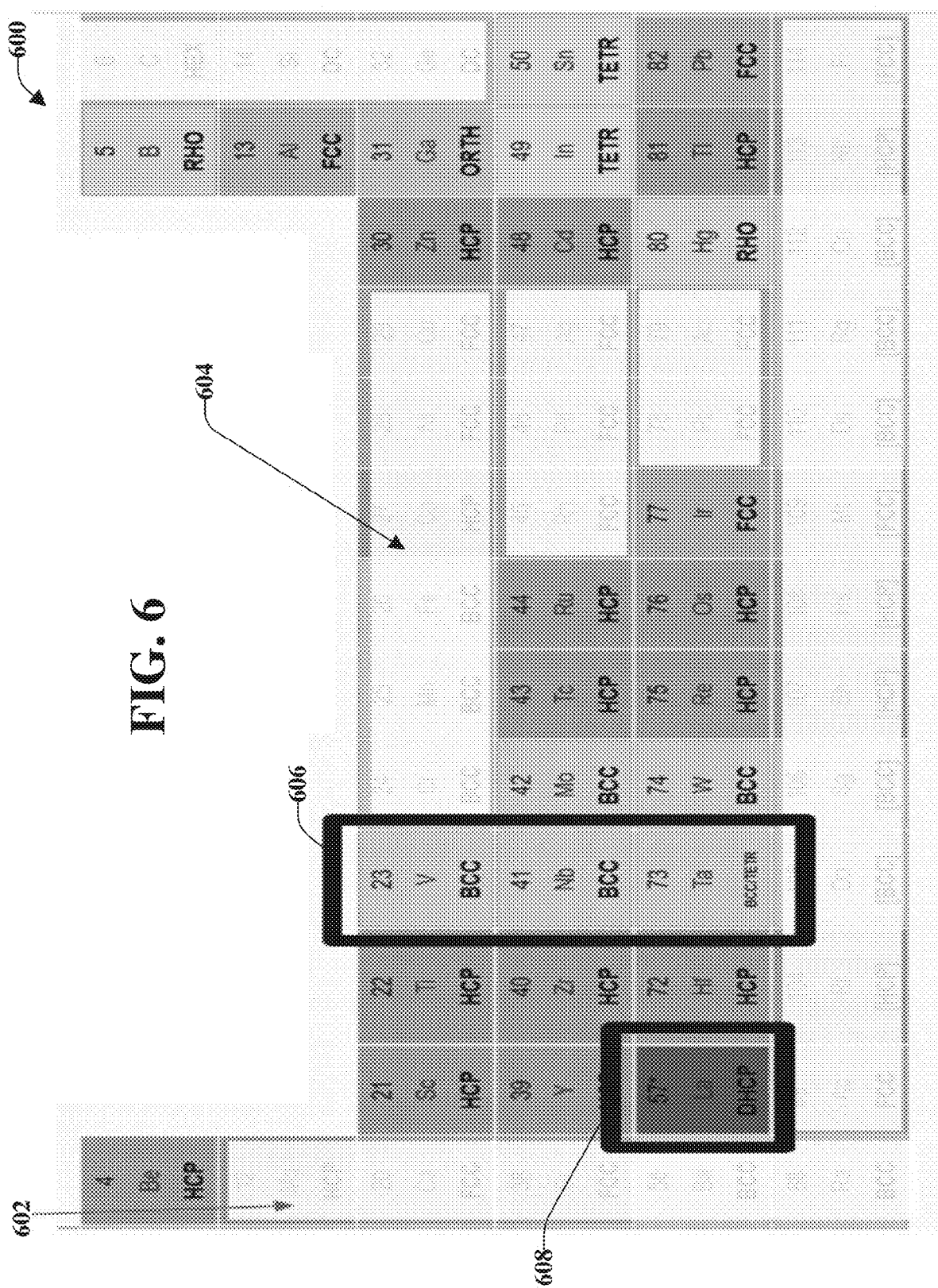
FIG. 6 illustrates an example, non-limiting, chart that identifies superconducting elements in accordance with one or more embodiments described herein.

FIG. 6 illustrates an example, non-limiting, chart 600 that identifies superconducting elements in accordance with one or more embodiments described herein. Repetitive description of like elements employed in other embodiments described herein is omitted for sake of brevity.

The chart 600 can be, or can include, the elements from chart 500 of FIG. 5. According to some implementations, a group of elements from which the selection of elements can be made can be reduced in size in order to facilitate the selection. For example, to reduce the size or number of elements from which a selection can be made, those elements that are not superconducting elements can be removed from consideration. However, as previously noted, in accordance with some implementations, non-superconducting elements can be selected. Thus, the process described with respect to FIG. 6 is one example of how elements can be selected as discussed herein.

As illustrated at 602 and 604 (other portions not labeled for purposes of simplicity), non-superconducting elements can be "greyed out" or removed from consideration. In this example, the group of elements indicated in the chart 500 of FIG. 5 can be reduce to the group of elements indicated in the chart 600 of FIG. 6. Thus, by comparing chart 600 with chart 500, around thirty-one elements are removed from consideration.

Figure 7:
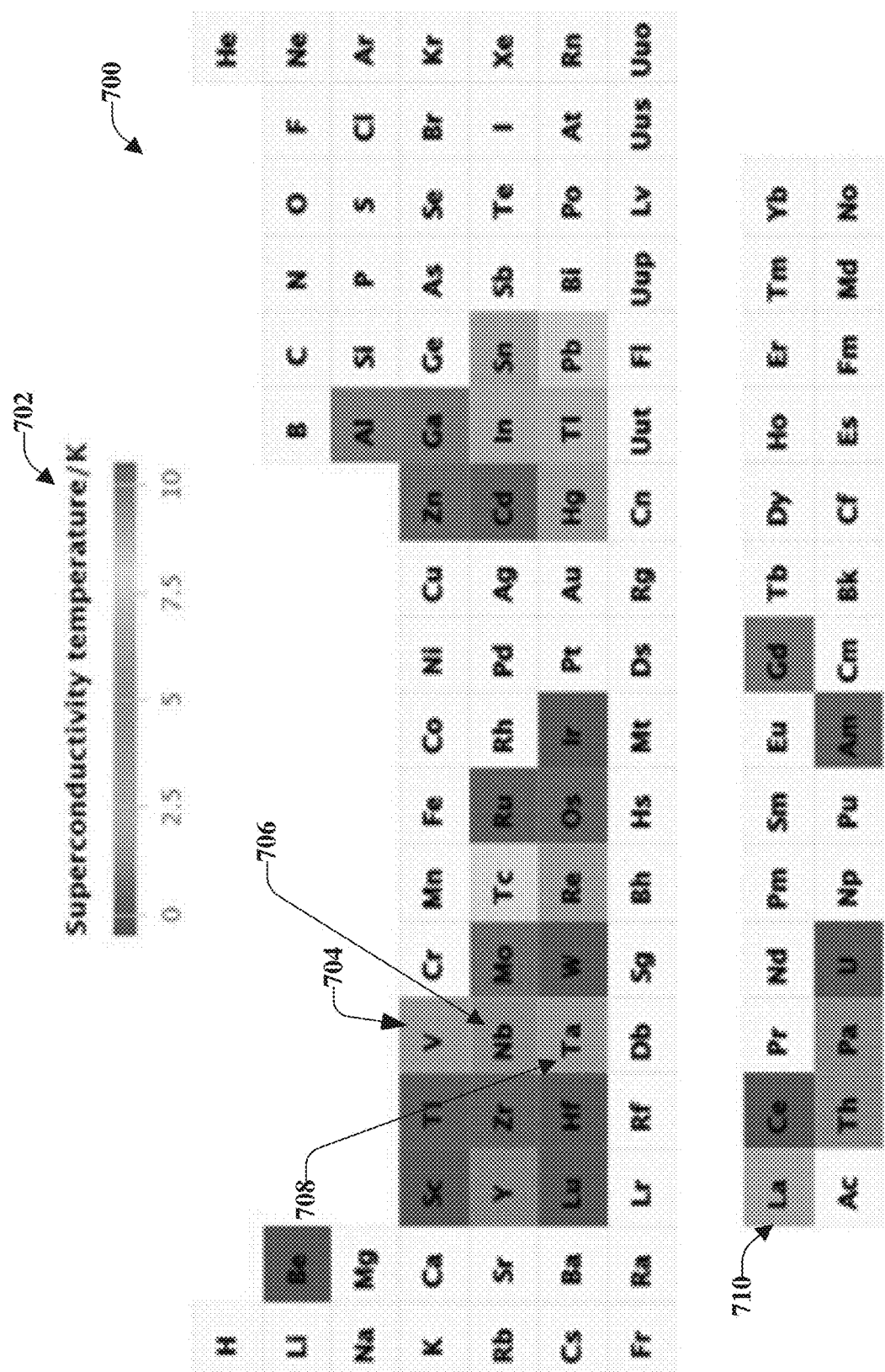
FIG. 7 illustrates an example, non-limiting periodic table and associated superconductivity temperature scale in accordance with one or more embodiments described herein.

FIG. 7 illustrates an example, non-limiting, periodic table 700 and associated superconductivity temperature scale 702 in accordance with one or more embodiments described herein. Repetitive description of like elements employed in other embodiments described herein is omitted for sake of brevity.

The associated superconductivity temperature scale 702 is expressed in Kelvin, wherein different hues along the scale indicates the temperature of an element. Four elements are indicated as having some of the highest superconducting temperature (Tc) as compared to the other elements in the periodic table 700. These elements are vanadium (V) 704, niobium (Nb) 706, tantalum (Ta) 708, and lanthanum (La) 710. Accordingly, these four elements have a high superconducting temperature (Tc) as compared to the other superconducting elements. Accordingly, when selecting two or more elements, the selection can include at least one of these four elements in some implementations, as indicated by boxes 606 and 608 of FIG. 6. However, it is noted that the disclosed aspects are not limited to these implementations and there can be selection of other materials.

The table below illustrates example, non-limiting, alloys that can be utilized in accordance with one or more embodiments described herein.

| Atomic number - High Tc element | Mixing element with: No phases/very low solubility | Compatible with current processing |
| --- | --- | --- |
| 23 - V | 39Y, 21Sc, 57La, 58Ce, 40 Zr in alpha phase | Y, La, Zr, Sc |
| 41 - Nb | 21Sc, 39Y, 57La, 58Ce, all rare earths, In, Ag, 40 Zr in alpha phase | Y, La, Zr, Sc |
| 50 - Sn | 13Al, 75Re, 73Ta | No |
| 57 - La | 23V, 41Nb, 73Ta, 42Mo, 74W, 75Re | V, Nb, Ta, Mo, W, Re |
| 73 - Ta | 21Sc, 39Y, 57La, 58Ce and all rare earths, 49In, 40Zr in alpha phase. | Y, La, Zr, Sc |

The first column illustrates five elements, namely, atomic number 23 vanadium (V); atomic number 41 niobium (Nb), atomic number 50 tin (Sn), atomic number 57 lanthanum (La), and atomic number 73 tantalum (Ta). These five elements exhibit some of the five highest Tc.

Starting from these five elements, other elements are identified in the second column to attempt to form amorphous alloys. The second column elements exhibit low solubility, do not form intermetallic phases, and possess a different crystal structure than the starting element in the first column. Accordingly, the second column illustrates the mixing elements for the respective starting element in the first column.

Thus, as indicated in the first row, vanadium (V) can be mixed separately with yttrium (Y), scandium (Sc), lanthanum (La), cerium (Ce), and zirconium (Zr), in alpha phase. Some elements are eliminated as not desired to be used and other elements were eliminated as not expected to work at a defined confidence level. Accordingly, as indicated in the third column of the table, the elements determined to be compatible with vanadium (V) and with the current processing are, in this example, determined to be yttrium (Y), lanthanum (La), zirconium (Zr), and scandium (Sc).

In a similar manner, niobium (Nb) can be mixed separately with scandium (Sc), yttrium (Y), lanthanum (La), cerium (Ce), all rare earths, indium (In), silver (Ag), zirconium (Zr), in alpha phase. Through elimination, the elements determined to be compatible with niobium (Nb) and with the current processing are, in this example, determined to be yttrium (Y), lanthanum (La), zirconium (Zr), and scandium (Sc).

Further, in a similar manner, tin (Sn) can be mixed separately with aluminum (Al), rhenium (re), and tantalum (Ta). Through elimination, it was determined that there were no elements compatible with tin (Sn) for the example experiment. It is noted, however, that although discussed with specific choices, other choices can be utilized with the disclosed aspects. For example, elements in column 2 could be utilized and elements in column 3 could be easier to process. Accordingly, there could be a process that could be utilized for a Sn alloy, for example.

In a similar fashion, lanthanum (La) can be mixed separately with vanadium (V), niobium (Nb), tantalum (Ta), molybdenum (Mo), tungsten (W), and rhenium (Re). Through elimination (e.g., eliminating elements not desired to be used, eliminating elements not expected to work at a defined confidence level), elements determined to be compatible with lanthanum (La) and with the current processing are, vanadium (V), niobium (Nb), tantalum (Ta), molybdenum (Mo), tungsten (W), and rhenium (Re).

Further, tantalum (Ta) was mixed separately with scandium (Sc), yttrium (Y), lanthanum (La), cerium (Ce), and all rhenium (Re), indium (In), and zirconium (Zr), in alpha phase. Through elimination, the elements determined to be compatible with tantalum (Ta) and with the current processing are, in this example, yttrium (Y), lanthanum (La), zirconium (Zr), and scandium (Sc).

It is noted that the bolded elements in the third column are considered to be the elements determined to be the more favored elements in this example. Based on the sample mixing and after the elements were tested, it was determined that mixing tantalum (Ta) with zirconium (Zr) provides an amorphous film that comprises desired properties. Amorphous meaning not crystalline. It is noted that if the number of elements mixed can be increased respecting selection criteria above (e.g., more than two elements), there is more probability of the mixture to be amorphous as deposited.

Basically, as a starting point, six elements with the high superconducting temperatures: vanadium (V), niobium (Nb), tantalum (Ta), lanthanum (La), indium (In), and tin (Sn) can be selected. While work can be performed with indium (In) and tin (Sn), their low melting points (e.g., 156° C. and 232° C.) can lead to low melting point alloys which is not compatible with the back end of line (BEOL) processing of the devices. While the indium (In) and tin (Sn) alloys can also be utilized with the disclosed aspects, these alloys might incur complications related to fabrication.

Most of the proposed alloys mixed elements exhibiting hexagonal compact (HCP) or double hexagonal compact (DHCP) crystal structures with elements existing in the body centered cubic (BCC) crystal structure. Looking into the lack of intermetallics, the low solubility and the different atomic sizes, the tendency was to mix: vanadium (V) with yttrium (Y), lanthanum (La) or zirconium (Zr); neodymium (Nb) with lanthanum (La) or scandium (Sc); lanthanum (La) with vanadium (V), neodymium (Nb), tantalum (Ta), molybdenum (Mo), tungsten (W) or rhenium (Re); or tantalum (Ta) with yttrium (Y), lanthanum (La), zirconium (Zr), or scandium (Sc).

It is noted that adding Al (face centered cubic) or indium (In) and/or tin (Sn) (tetragonal) to the mix can help in forming an amorphous film upon deposition. This can result in a quaternary made of four elements which all have different crystal structures. It is also noted that tantalum-zirconium (Ta—Zr) amorphous films can remain amorphous to above 800° C. as long as the zirconium (Zr) concentration is about 25 at. %. Amorphous state is measured using X-Ray diffraction and transmission electron microscopy.

Figure 8:
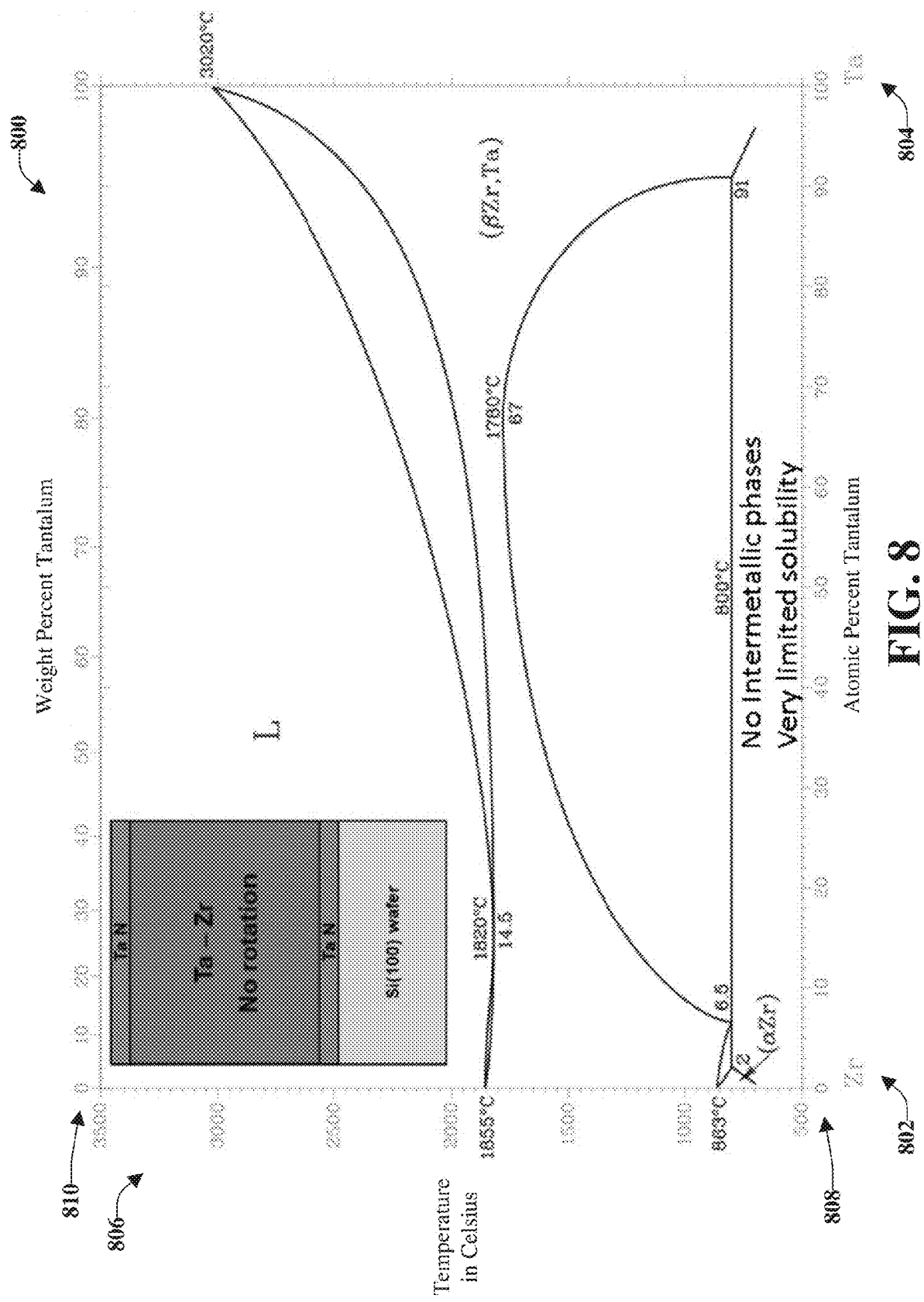
FIG. 8 illustrates an example, non-limiting, equilibrium binary phase diagram of tantalum and zirconium which reveals how tantalum and zirconium mix at equilibrium in accordance with one or more embodiments described herein.

FIG. 8 illustrates an example, non-limiting, equilibrium binary phase diagram 800 of Ta and Zr which reveals how Ta and Zr mix at equilibrium. One can appreciate the absence of intermetallic phases and the low miscibility of Ta and Zr in accordance with one or more embodiments described herein. Temperature in Celsius is illustrated on the vertical axis 806, atomic percent tantalum is illustrated on the bottom horizontal axis 808, and weight percent tantalum is illustrated on the top horizontal axis 810. To test the material, a wafer can be loaded into a sputtering chamber, which contains multiple sputtering sources. Using such a system, a continuous composition gradient can be formed on a wafer covering the entire range of composition presented here. In a typical deposition, the sputtering power to each sources is controlled so the concentration ranges from around 90% atomic percentage (at %) of tantalum (Ta) on one side of the wafer to around 20 percent atomic percentage (at %) of tantalum (Ta) on the other side of the wafer. In this example, there can be a larger atomic percentage of zirconium (Zr) if the deposition rate from the Zr source is increased.

The two materials (tantalum (Ta) and zirconium (Zr)) can be sputtered to vary the composition across the wafer. For example, co-sputtering in a sputtering tool can be performed without rotation using two elemental sputtering sources located on each side of a wafer. The composition of the sputtered film can vary across the wafer depending on deposition rate from each source, here varying from around 90 atomic percentage (90 at %) tantalum (Ta) to about 20 atomic percentage (20 at %) tantalum (Ta). The wafer can be diced so that different pieces exhibit a different composition. The pieces can be annealed in order to evaluate various physical properties of the Ta—Zr film. The composition can vary between tantalum (Ta) as indicated at 802, to zirconium (Zr), as indicated at 804. In an example, the tested film thickness is about 40 nm and the alloy was deposited on a thin TaN underlayer (~5 nm) and capped with a similar thin TaN film. Measurements of sheet resistance (Rs), composition (Rutherford backscattering spectrometry (RBS)), Transmission Electron Microscopy (TEM) and X-Ray diffraction (XRD) versus temperature can be measured.

X-ray diffraction is measured during annealing to determine if the Ta—Zr film is amorphous as deposited and if it crystallizes easily with a specific thermal budget. There should be enough of a process window to build those devices and to anneal during the process or anneal during the joining at the end to build the packages, while not crystalizing the amorphous alloy.

Figure 9:
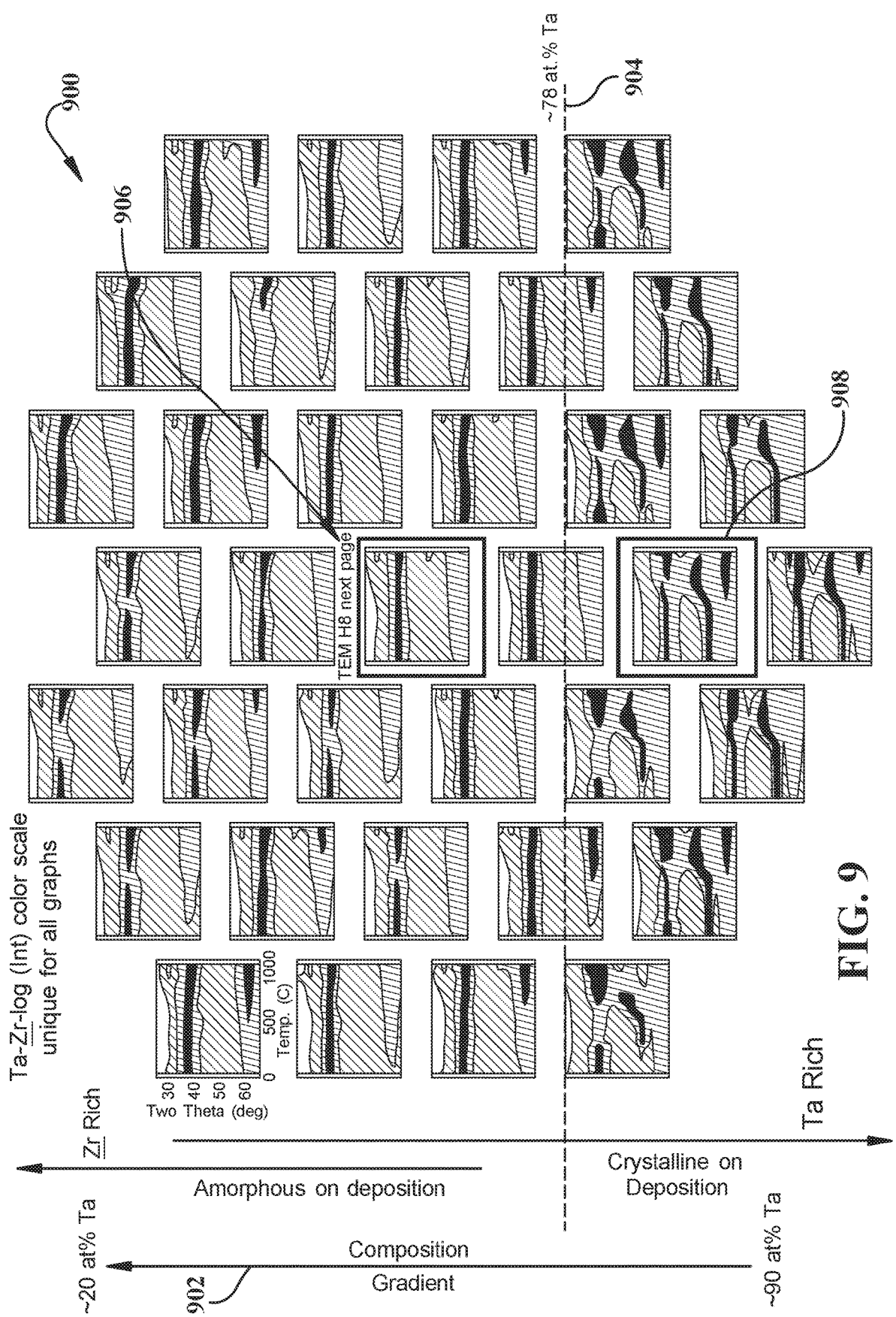
FIG. 9 illustrates graphs of a diced wafer that comprises a tantalum-zirconium film in accordance with one or more embodiments described herein.

FIG. 9 illustrates graphs 900 of a diced wafer that comprises a Tantalum-Zirconium (Ta—Zr) film in accordance with one or more embodiments described herein. More specifically, illustrated is in situ XRD where the wafer is annealed to more than 1000 degrees Celsius at 4.5 C/s in purified He. A wafer with Ta—Zr film is diced and thirty-six of the pieces (of the diced wafer) are annealed. The XRD of thirty-six slices are depicted by the graphs 900.

The composition gradient of Ta is illustrated at 902 and varies from around 20 atomic percentage of tantalum (Ta) to around 90 atomic percentage tantalum (Ta). The dashed line 904 represents around 78 atomic percentage tantalum (Ta). Above the dashed line 904 is a lower tantalum (Ta) content, below the dashed line 904 is a higher tantalum (Ta) content. The X-ray peaks are, or become, sharp during anneal, showing crystallinity. Films remain amorphous during anneal above the dashed line 904. However, films below the dashed line 904 are either crystalline on deposition or become crystalline upon annealing.

In further detail, in a processing station, x-ray diffraction (XRD) was performed during the anneal. To obtain the different graphs 900, one piece can be loaded in the system and a determination of annealing versus temperature can be performed. The temperature can rise to around 1000 degrees Celsius during the anneal process. The graphs 900 illustrate that starting from a certain position on the wafer there can be very wide peaks that are typical for a measurement of an amorphous (or a liquid) film. Below the dashed line 904 at about 3 to 1 (tantalum (Ta) to zirconium (Zr)) the peaks are very sharp. The first graph 906 represents an amorphous sample, and the second graph 908 represents a crystalline sample. The first graph 906 will be discussed with respect to the following figures.

Figure 10:
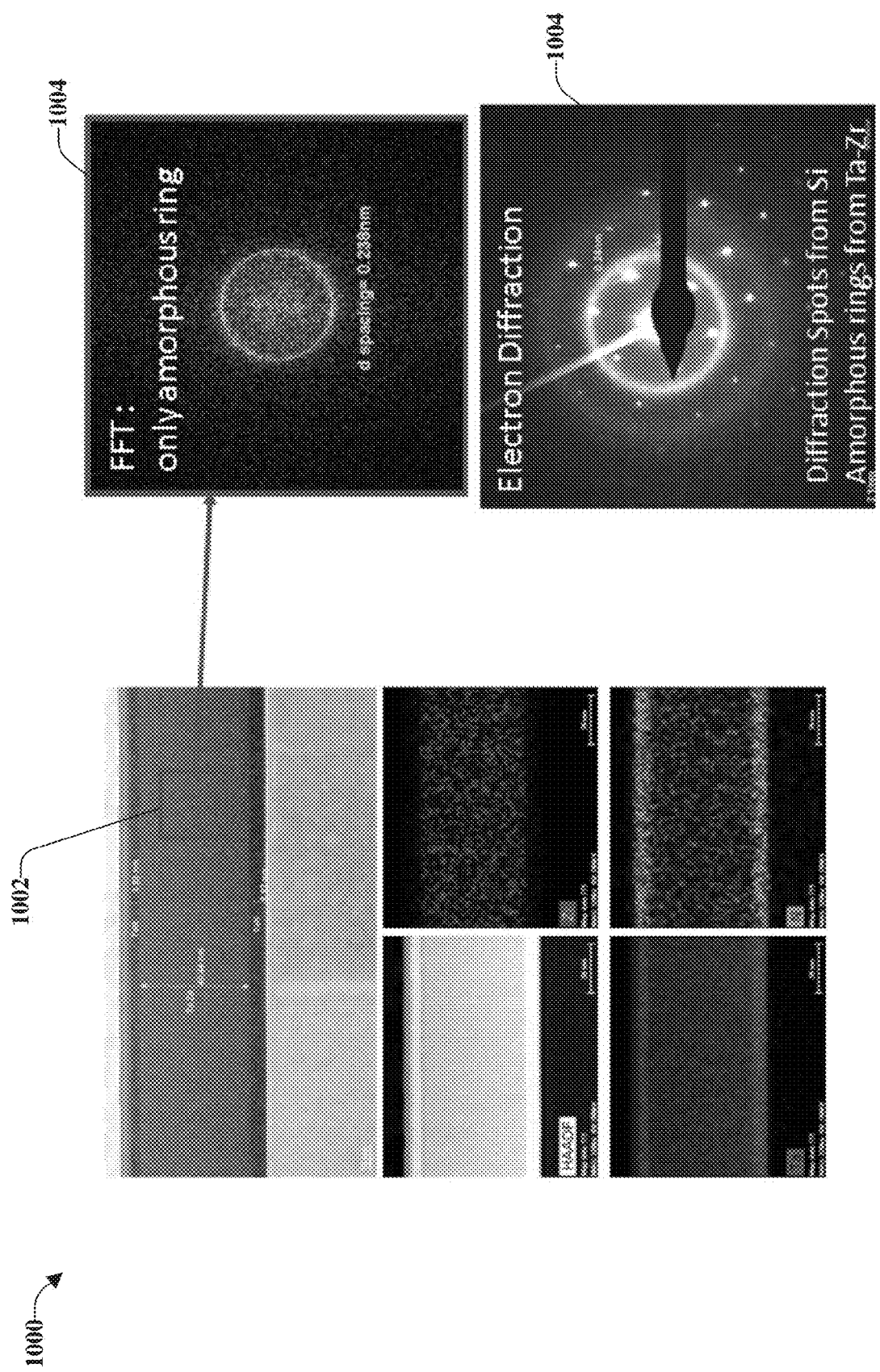
FIG. 10 illustrates a transmission electron microscopy image of the sample indicated by the first graph of FIG. 9 in accordance with one or more embodiments described herein.

FIG. 10 illustrates a Transmission Electron Microscopy (TEM) image of the sample indicated by the first graph 906 of FIG. 9 in accordance with one or more embodiments described herein. This image was taken prior to annealing. Repetitive description of like elements employed in other embodiments described herein is omitted for sake of brevity.

Figure 11:
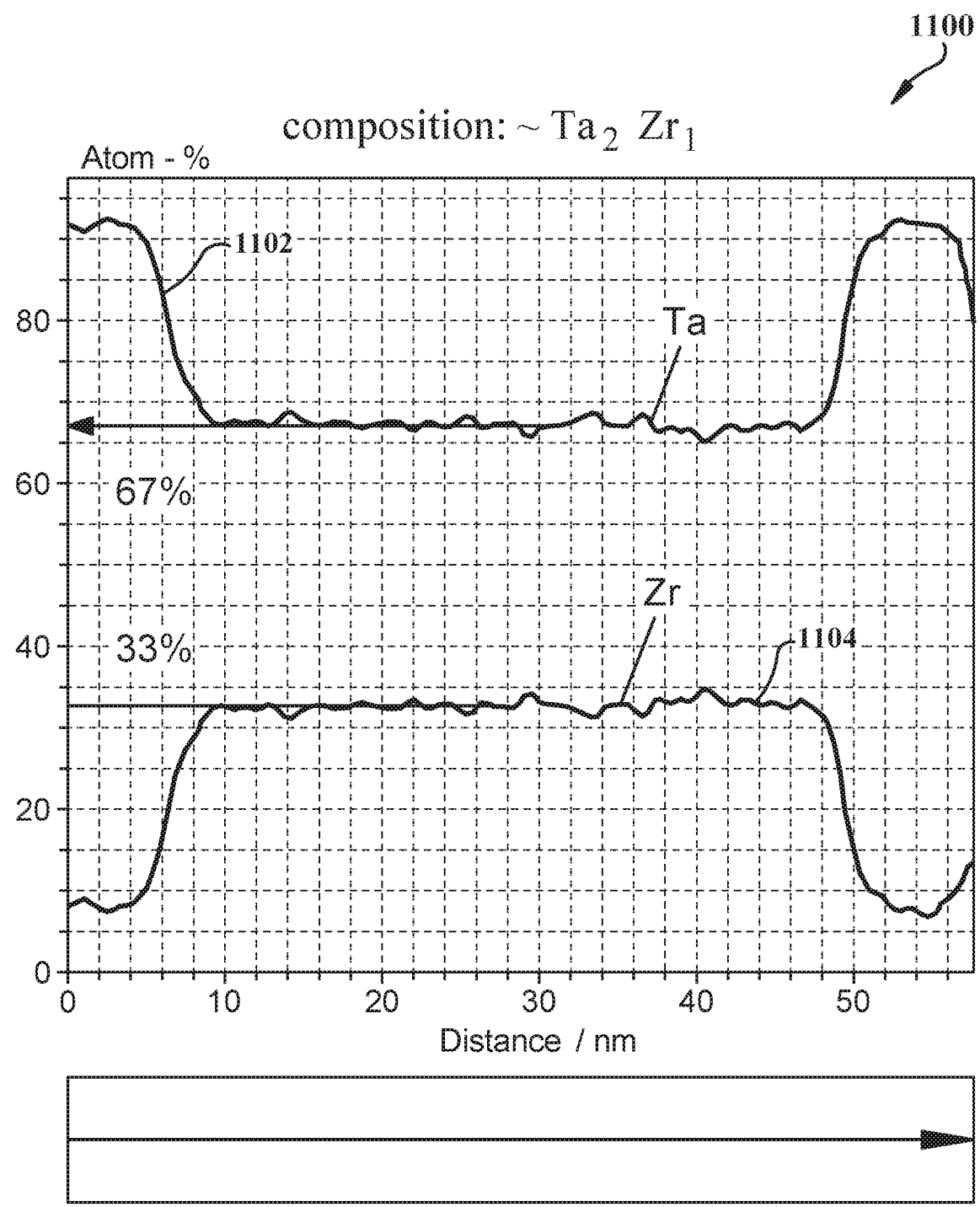
FIG. 11 illustrates an example, non-limiting graph of the composition of the film of FIG. 10 in accordance with one or more embodiments described herein.

The film 1002 indicated by the box does not show any crystallinity. The film is an amorphous Ta—Zr alloy at sample location: H8 of FIG. 9 prior to annealing. The film was shown to be amorphous using TEM. As indicated at 1104 and 1006, the presence of diffuse rings in both in Fast Fourier Transform (FFT) images and electron diffraction images confirms that the film is amorphous. The electron diffraction 1006 contains both the diffuse ring from the amorphous film and the signature spots from the crystalline substrate. It is noted that if the film were crystalline, there would be diffraction spots from the film similar to that of the substrate but in different positions. As indicated in the electron diffraction 1006, the diffraction spots are from silicon (Si) and the amorphous rings from Ta—Zr. FIG. 11 illustrates an example, non-limiting graph 1100 of the composition of the film 1002 of FIG. 10 in accordance with one or more embodiments described herein. The concentration of Ta and Zr is given from bottom to top of the film. The first line 1102 is for Ta concentration. The second line 1104 is for Zr concentration. The TaN bottom and top films are indicated by the high Ta and low Zr concentrations at these positions. The Ta—Zr amorphous film composition is shown to be uniform at 67 at. % Ta and 33 at. % Zr or a ratio of 2 Ta atoms per Zr atom.

Figure 12:
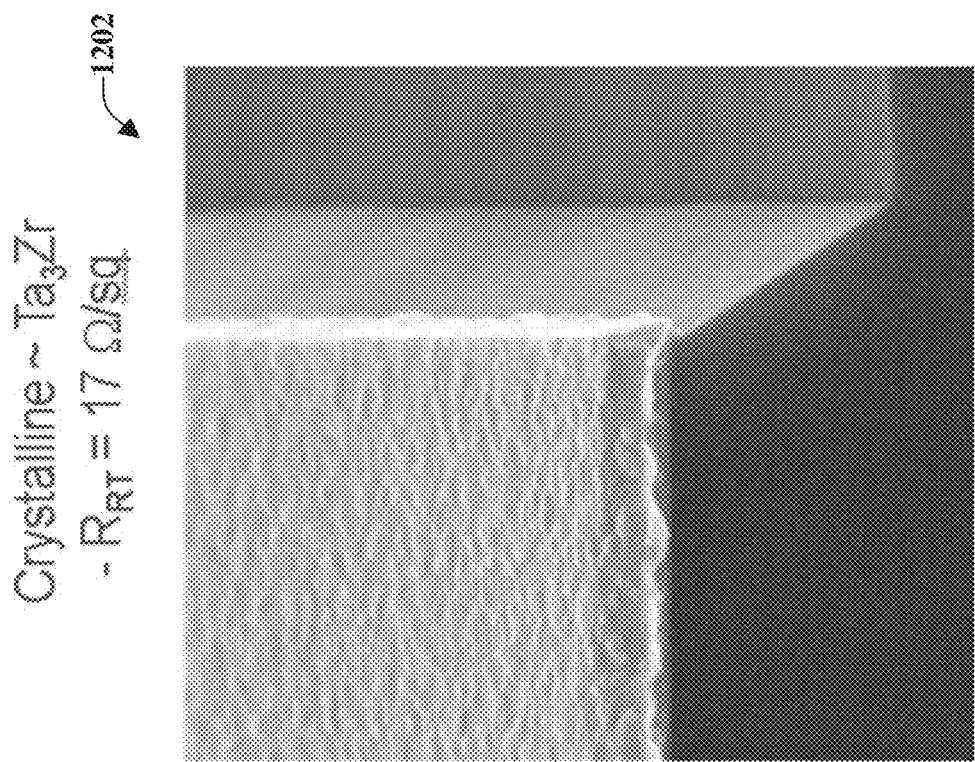
FIG. 12 illustrates an example, non-limiting, comparison between two resonators in accordance with one or more embodiments described herein.
Figure 12:
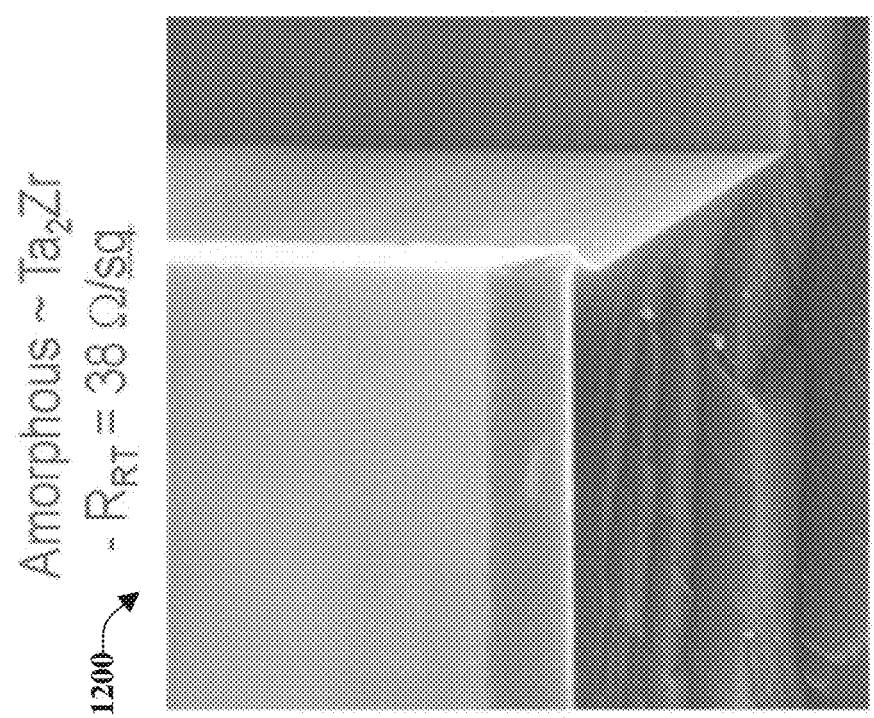

FIG. 12 illustrates an example, non-limiting, comparison between two resonators in accordance with one or more embodiments described herein. Illustrated are a first picture of a portion of a first resonator 1200 and a second picture of a portion of a second resonator 1202.

When processing is performed on the deposited alloys of composition corresponding to first graph 906 and second graph 908 of FIG. 9, physical characteristics can be evaluated post processing of resonator fabrication. Resonator 1200 is amorphous and from first graph 906 while resonator 1202 is crystalline and from second graph 908. Images of the first resonator 1200 in comparison with the second resonator 1202 appears to have a surface that is much more uniform and flat. The image of the second resonator 1202 has a surface that shows significant roughness. Processing amorphous material can thus help to maintain a smooth surface through the fabrication process.

Figure 13:
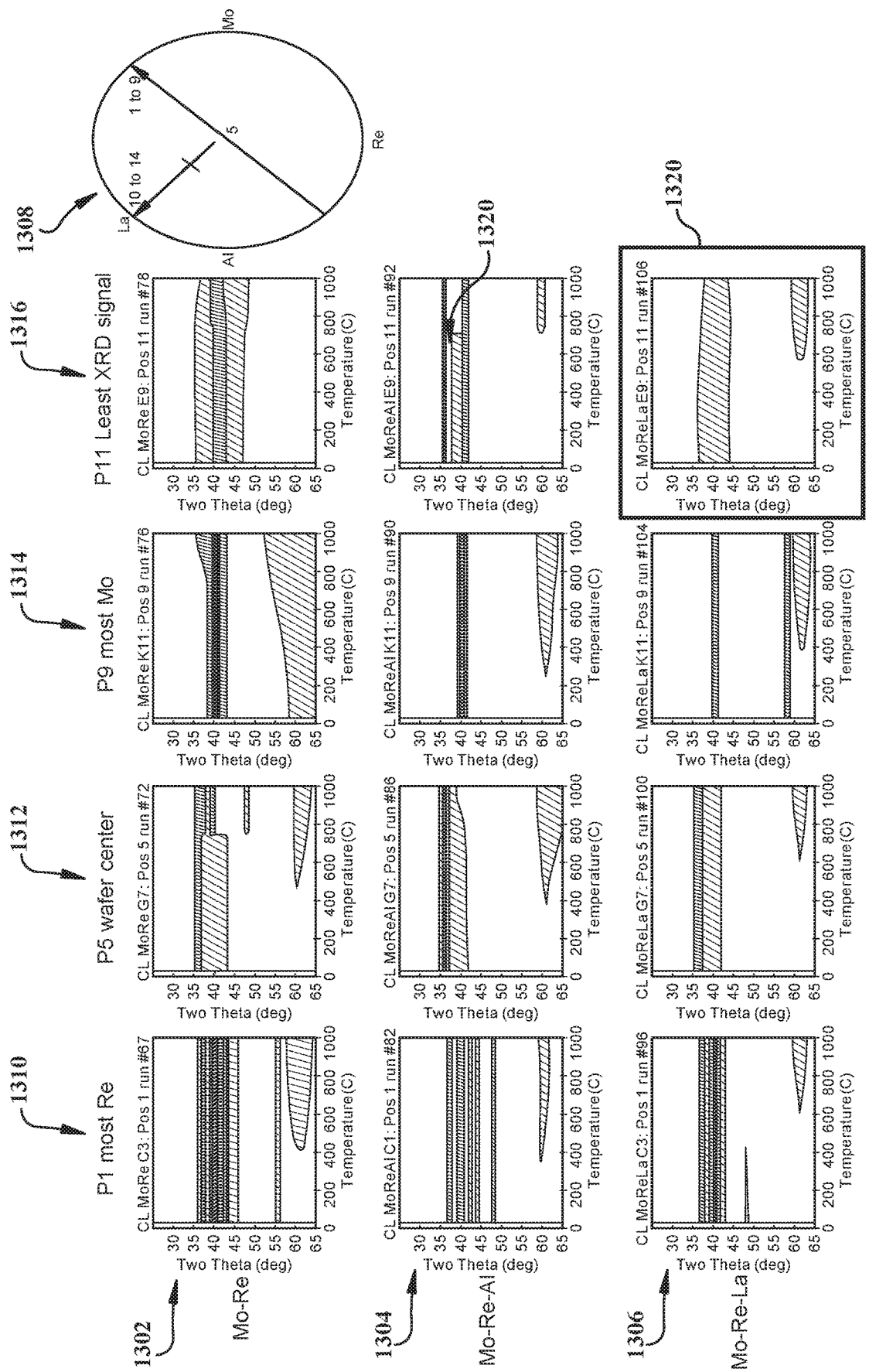
FIG. 13 illustrates example, non-limiting, charts of other example combinations of elements, in accordance with one or more embodiments described herein.

FIG. 13 illustrates example, non-limiting, charts of other example combinations of elements, in accordance with one or more embodiments described herein. In this example, we also use the x-ray diffraction during annealing to evaluate Molybdenum (Mo) alloys. The top row 1302 depicts Molybdenum (Mo)-Rhenium (Re), the middle row 1304 depicts Molybdenum (Mo)-Rhenium (Re)-Aluminum (Al), the bottom row 1306 depicts Molybdenum (Mo)-Rhenium (Re)-Lanthanum (La). A representation of a wafer 1308 indicates where the targets are located during a sputter process.

The first column 1310 indicates P1 (lower left position on wafer 1308) with the most Re, the second column 1312 indicates P5 wafer 1308 center, the third column 1314 indicates P9 most Molybdenum (Mo) (see wafer 1308), and the fourth column 1316 indicates P11 least XRD signal at the "X" position on the wafer 1308.

The XRD peaks in FIG. 13 are most intense when the concentration in Re or Mo is high (first column 1310 and third column 1314). In the middle of the wafer (second column 1312), XRD intensity is typically lower. At fourth column 1316, when Aluminum (Al) or Lanthanum is added, the peaks are greatly reduced in intensity. As indicated at 1320, the Molybdenum (Mo)-Rhenium (Re)-Lanthanum (La) does not show any sharp diffraction peaks below 900° C., another example of amorphous film present to high temperatures. The mixture indicated at 1320 can thus be the selected mixture according to one or more embodiments discussed herein.

Accordingly, as discussed herein, two or more elements can be mixed to produce an amorphous superconducting component. In an example, the amorphous superconducting component can be utilized in a quantum circuit. In another example, the amorphous superconducting component can be utilized in a device. The amorphous superconducting component can remain amorphous to an elevated temperature, such as at least 600 degrees Celsius, for example. Further, the two or more elements with the amorphous superconducting alloy or amorphous superconducting component can comprise at least two elements that do not form compounds even under equilibrium conditions.

As discussed herein, provided is a quantum circuit in which superconducting elements are built from amorphous metal alloys. Surface and interfaces of quantum elements of a circuit can be smoother as compared to traditional microcrystalline superconductors (no microstructure). Further, a quantum circuit can comprise superconducting elements build from amorphous metal allows that can eliminate grain boundaries and create surfaces and interfaces of quantum devices of the quantum circuit that are smoother relative to microcrystalline superconductors.

The resonators discussed herein can be built using co-sputtering systems where two (or more) elements are sputtered simultaneously from different targets to form a film that is amorphous. Guidelines include, but are not limited to elements that are superconducting, elements with different crystal structures, elements that do not form intermetallic compounds, elements with different atomic radii (different sizes), elements that are not miscible in each other, and elements for which the solubility in each other is low. While not many elements satisfy the example guidelines above, the more criteria that are satisfied, the more the likelihood of a strong barrier to crystallization of phase upon deposition leaving the deposited film in an amorphous state.

Since an amorphous film does not show variations through the material as poly crystalline films do, the material reacts uniformly to any type of processing necessary to build a device. As a result, the surfaces remain uniform in composition and flat. Controlling surface uniformity can assist with controlling losses in multiple Qubit circuits.

It is noted that the following figures are discussed with respect to a classical computer. The quantum circuit, as discussed herein, can be utilized in conjunction with the classical computer more fully described below.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 14:
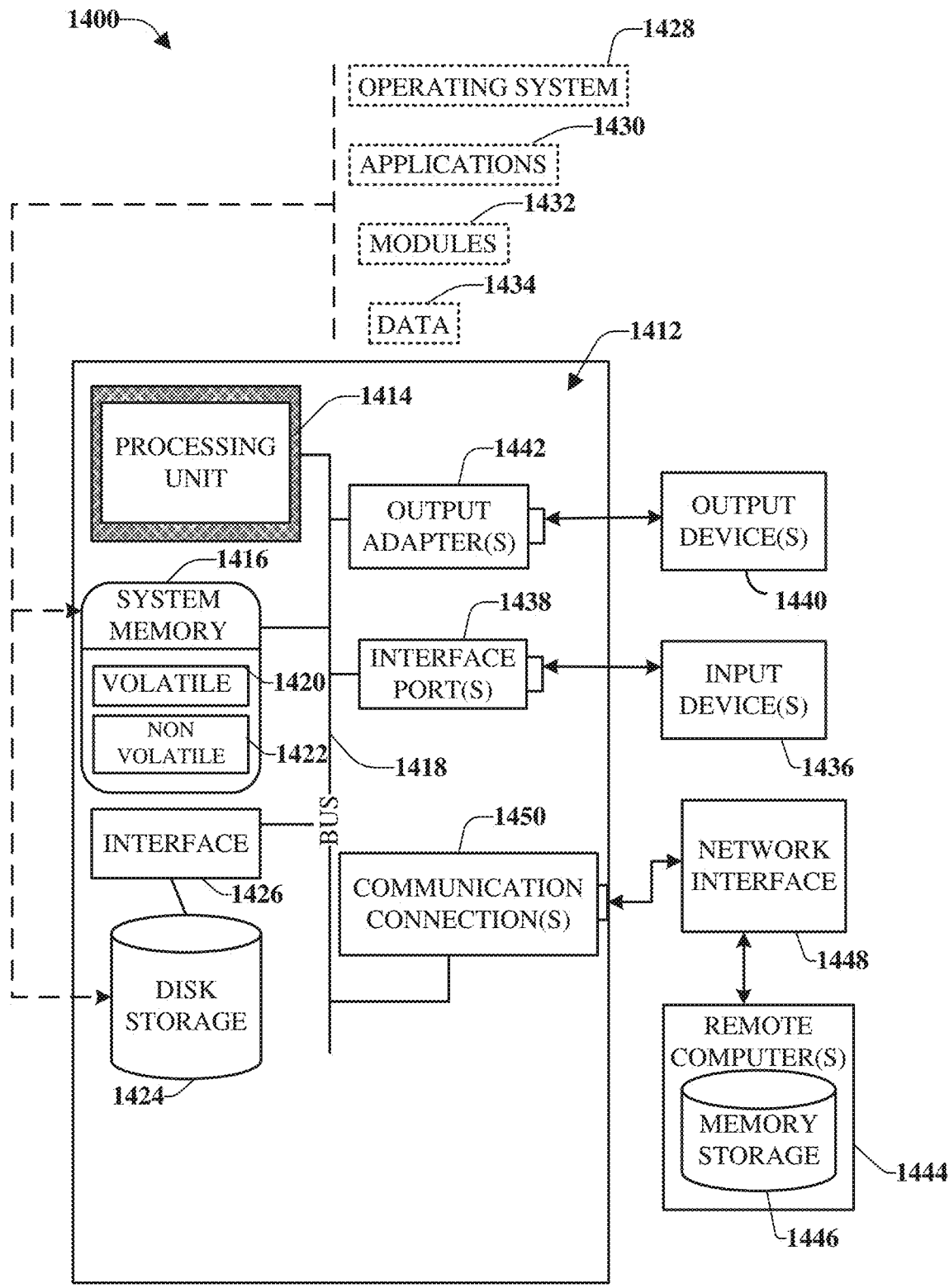
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is omitted for sake of brevity. With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412. System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB).

Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a method of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum circuit, comprising:
one or more superconducting components that comprise an amorphous superconducting alloy comprising at least three elements, wherein at least one element of the at least three elements is superconducting, and wherein the at least three elements comprise one of:
a first combination of elements comprising vanadium and two different elements selected from a first group consisting of yttrium, lanthanum, zirconium, and scandium,
a second combination of elements comprising niobium and two different elements selected from the first group,
a third combination of elements comprising tantalum and two different elements selected from the first group, or
a fourth combination of elements comprising lanthanum two different elements selected from a second group consisting of vanadium, niobium, tantalum, molybdenum, tungsten, and rhenium.

2. The quantum circuit of claim 1, wherein a first element of the at least three elements comprises a first crystal structure, and a second element of the at least three elements comprises a second crystal structure different from the first crystal structure.

3. The quantum circuit of claim 1, wherein a first element of the at least three elements comprises a first atomic size, and a second element of the at least three elements comprises a second atomic size different from the first atomic size.

4. The quantum circuit of claim 1, wherein the amorphous superconducting alloy further comprises aluminum.

5. The quantum circuit of claim 1, wherein the amorphous superconducting alloy further comprises tin.

6. The quantum circuit of claim 1, wherein a first element of the at least three elements is superconducting at a defined temperature range and a second element of the at least three elements is not superconducting at the defined temperature range.

7. The quantum circuit of claim 1, wherein the amorphous superconducting alloy further comprises indium.

8. A device, comprising:
one or more superconducting components that comprise an amorphous superconducting alloy comprising at least three elements, wherein at least one element of the at least three elements is superconducting, and wherein the at least three elements comprise one of:
a first combination of elements comprising vanadium and two different elements selected from a first group consisting of yttrium, lanthanum, zirconium, and scandium,
a second combination of elements comprising niobium and two different elements selected from the first group,
a third combination of elements comprising tantalum and two different elements selected from the first group, or
a fourth combination of elements comprising lanthanum two different elements selected from a second group consisting of vanadium, niobium, tantalum, molybdenum, tungsten, and rhenium.

9. The device of claim 8, wherein a first element of the at least three elements comprises a first crystal structure, and a second element of the at least three elements comprises a second crystal structure different from the first crystal structure.

10. The device of claim 8, wherein a first element of the at least three elements comprises a first atomic size, and a second element of the at least three elements comprises a second atomic size different from the first atomic size.

11. The device of claim 8, wherein the amorphous superconducting alloy further comprises aluminum.

12. The device of claim 8, wherein the amorphous superconducting alloy further comprises tin.

13. The device of claim 8, wherein a first element of the at least three elements is superconducting at a defined temperature range and a second element of the at least three elements is not superconducting at the defined temperature range.

14. The device of claim 8, wherein the amorphous superconducting alloy further comprises indium.

15. A method, comprising:
    selecting a combination of at least three elements, wherein at least one element of the at least three elements is superconducting, and wherein the combination comprises one of:
    a first combination of elements comprising vanadium and two different elements selected from a first group consisting of yttrium, lanthanum, zirconium, and scandium,
    a second combination of elements comprising niobium and two different elements selected from the first group,
    a third combination of elements comprising tantalum and two different elements selected from the first group, or
    a fourth combination of elements comprising lanthanum two different elements selected from a second group consisting of vanadium, niobium, tantalum, molybdenum, tungsten, and rhenium; and
    forming amorphous superconducting components using the combination of at least three elements, wherein the amorphous superconducting components are adapted to interface with one or more quantum components of a quantum circuit.

16. The method of claim 15, wherein the combination of at least three elements further comprises aluminum.

17. The method of claim 15, further comprising depositing the two or more elements on a room temperature substrate using a sputtering process.

18. The method of claim 15, wherein a first element of the at least three elements comprises a first crystal structure, and a second element of the at least three elements comprises a second crystal structure different from the first crystal structure.

19. The method of claim 15, wherein the combination of at least three elements further comprises indium.

20. The method of claim 15, wherein a first element of the at least three elements comprises a first atomic size, and a second element of the at least three elements comprises a second atomic size different from the first atomic size.

* * * * *